(12) United States Patent
Rohrbach

(10) Patent No.: US 10,694,629 B2
(45) Date of Patent: Jun. 23, 2020

(54) SYSTEM WITH MULTIPLE DISPLAYS

(71) Applicant: Apple Inc., Cupertino, CA (US)

(72) Inventor: Matthew D. Rohrbach, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/277,985

(22) Filed: Feb. 15, 2019

(65) Prior Publication Data

US 2019/0182972 A1  Jun. 13, 2019

Related U.S. Application Data

(63) Continuation of application No. 15/812,905, filed on Nov. 14, 2017, now Pat. No. 10,251,287, which is a
(Continued)

(51) Int. Cl.
*G06F 1/16* (2006.01)
*H05K 5/02* (2006.01)
(Continued)

(52) U.S. Cl.
CPC ........ *H05K 5/0204* (2013.01); *B60R 11/0252* (2013.01); *F16M 11/041* (2013.01); *F16M 11/22* (2013.01); *F16M 11/242* (2013.01); *F16M 13/00* (2013.01); *F16M 13/022* (2013.01); *G06F 1/1615* (2013.01); *G06F 1/1633* (2013.01); *H01F 7/0252* (2013.01); *H04B 1/3877* (2013.01); *H05K 1/0216* (2013.01); *H05K 1/0298* (2013.01); *H05K 9/002* (2013.01); *B60R 2011/0028* (2013.01); *H04M 1/04* (2013.01); *H05K 2201/0707* (2013.01)

(58) Field of Classification Search
CPC .... G06F 3/1454; G06F 3/1462; G06F 1/1615; G06F 1/1622
See application file for complete search history.

(56) References Cited

U.S. PATENT DOCUMENTS 5,839,186 A  11/1998  Onodera
6,386,413 B1  5/2002  Twyford
(Continued)

FOREIGN PATENT DOCUMENTS

CN  202548700 U  11/2012
EP  1276090 A1  1/2003
(Continued)

OTHER PUBLICATIONS

"Apple iPad 2 adds cameras and Smart Cover", Jessica Dolcourt and James Martin, CNET News, Mar. 3, 2011, 12 pages, URL: http://www.zdnet.co.uk/news/mobile-devices/2011/03/03/apple-ipad-2-adds-cameras-and-s . . . , downloaded Aug. 9, 2011.
(Continued)

*Primary Examiner* — Jeremy C Norris
(74) *Attorney, Agent, or Firm* — Dickinson Wright RLLP

(57) ABSTRACT

A magnetic stand for a tablet device is disclosed. The magnetic stand is configured to rigidly hold a portion of the tablet device in place and to shield the magnetic field from adversely affecting nearby devices susceptible to strong magnetic fields. The shielding portion of the magnetic stand allows for significant increases in magnetic field strength when compared to similarly configured, unshielded products.

19 Claims, 5 Drawing Sheets

Related U.S. Application Data continuation of application No. 14/882,294, filed on Oct. 13, 2015, now Pat. No. 9,839,147, which is a continuation of application No. 14/460,086, filed on Aug. 14, 2014, now Pat. No. 9,163,775, which is a continuation of application No. 13/223,110, filed on Aug. 31, 2011, now Pat. No. 8,824,166.

(51) Int. Cl.
| | |
|---|---|
| B60R 11/02 | (2006.01) |
| F16M 11/22 | (2006.01) |
| F16M 11/24 | (2006.01) |
| F16M 13/00 | (2006.01) |
| F16M 13/02 | (2006.01) |
| H04B 1/3877 | (2015.01) |
| H01F 7/02 | (2006.01) |
| F16M 11/04 | (2006.01) |
| H05K 1/02 | (2006.01) |
| H05K 9/00 | (2006.01) |
| B60R 11/00 | (2006.01) |
| H04M 1/04 | (2006.01) |

(56) References Cited

U.S. PATENT DOCUMENTS

| | | | |
|---|---|---|---|
| 6,428,172 | B1 | 8/2002 | Hutzel et al. |
| 6,700,775 | B1 | 3/2004 | Chuang et al. |
| 6,816,751 | B1 | 11/2004 | Alice et al. |
| 7,356,176 | B2 | 4/2008 | Fujii et al. |
| 7,541,907 | B2 | 6/2009 | Wang et al. |
| 7,984,886 | B2 | 7/2011 | Lin |
| 8,253,518 | B2 | 8/2012 | Lauder et al. |
| 8,289,115 | B2 | 10/2012 | Cretella, Jr. et al. |
| 8,344,836 | B2 | 1/2013 | Lauder et al. |
| 8,390,411 | B2 | 3/2013 | Lauder et al. |
| 8,459,599 | B2 | 6/2013 | Du et al. |
| 8,824,166 | B2 | 9/2014 | Rohrbach |
| 8,884,730 | B2 | 11/2014 | Lauder et al. |
| 9,163,775 | B2 | 10/2015 | Rohrbach |
| 9,839,147 | B2 | 12/2017 | Rohrbach |
| 2003/0098857 | A1 | 5/2003 | Gettemy et al. |
| 2004/0044682 | A1 | 3/2004 | Nakamura et al. |
| 2004/0198459 | A1* | 10/2004 | Oba .......... G06F 3/14 455/566 |
| 2004/0232291 | A1 | 11/2004 | Carnevali |
| 2005/0086800 | A1 | 4/2005 | Heidel |
| 2005/0243504 | A1 | 11/2005 | Wong et al. |
| 2006/0007645 | A1 | 1/2006 | Chen et al. |
| 2006/0075934 | A1 | 4/2006 | Ram |
| 2007/0034753 | A1 | 2/2007 | Lee |
| 2007/0155446 | A1 | 7/2007 | Ho et al. |
| 2007/0176902 | A1 | 8/2007 | Newman et al. |
| 2009/0091881 | A1* | 4/2009 | Lee ............ F16M 11/046 361/679.21 |
| 2009/0302799 | A1 | 12/2009 | Marquet et al. |
| 2010/0081377 | A1 | 4/2010 | Chatterjee et al. |
| 2010/0102182 | A1 | 4/2010 | Lin |
| 2010/0133409 | A1 | 6/2010 | Park et al. |
| 2010/0237206 | A1 | 9/2010 | Barker |
| 2010/0238620 | A1 | 9/2010 | Fish |
| 2010/0254111 | A1 | 10/2010 | Ligtenberg et al. |
| 2010/0308187 | A1 | 12/2010 | Lin |
| 2011/0064401 | A1 | 3/2011 | DeSorbo |
| 2011/0170252 | A1 | 7/2011 | Jones et al. |
| 2012/0194448 | A1 | 8/2012 | Rothkopf |
| 2013/0103236 | A1 | 4/2013 | Mehrgan |
| 2013/0144463 | A1 | 6/2013 | Ricci et al. |
| 2018/0070464 | A1 | 3/2018 | Rohrbach |

FOREIGN PATENT DOCUMENTS

| | | |
|---|---|---|
| EP | 1668600 B1 | 9/2009 |
| WO | 2011083492 A1 | 7/2011 |

OTHER PUBLICATIONS

Taiwanese Patent Application No. 101103152—Office Action dated Jun. 4, 2014.

European Patent Application No. 12704478.2—Office Action dated Jun. 12, 2014.

European Patent Application No. 12702354.7—Office Action dated Jun. 18, 2014.

Chinese Application for Invention No. 201210021265.0—Second Office Action dated Jul. 15, 2014.

PCT Patent Application No. PCT/US2012/023025—International Search Report and Written Opinion dated Dec. 13, 2012.

\* cited by examiner

SYSTEM WITH MULTIPLE DISPLAYS

CROSS REFERENCE TO RELATED APPLICATIONS

This application is a continuation application of U.S. patent application Ser. No. 15/812,905, filed Nov. 14, 2017, entitled "MAGNETIC STAND FOR TABLET DEVICE," now U.S. Pat. No. 10,251,287 issued Apr. 2, 2019, which is a continuation of U.S. patent application Ser. No. 14/882, 294, filed Oct. 13, 2015, entitled "MAGNETIC STAND FOR TABLET DEVICE, now U.S. Pat. No. 9,839,147 issued Dec. 5, 2017, which is continuation application of U.S. patent application Ser. No. 14/460,086, filed Aug. 14, 2014, entitled "MAGNETIC STAND FOR ELECTRONIC DEVICE," now U.S. Pat. No. 9,163,775 issued Oct. 20, 2015, which is a continuation application of U.S. patent application Ser. No. 13/223,110, filed Aug. 31, 2011, entitled "MAGNETIC STAND FOR TABLET DEVICE," now U.S. Pat. No. 8,824,166 issued Sep. 2, 2014. The entire contents of each of the foregoing applications are incorporated herein by reference.

FIELD

The described embodiments relate generally to an apparatus for supporting a tablet device. In particular an apparatus for magnetically attaching a tablet device to a supporting structure is disclosed.

BACKGROUND

Tablet devices are used in an increasingly wide range of applications. In many of these applications a way for conveniently mounting the device is required. A number of manufacturers have tried to produce such a device; however since most tablets have no built in mounting mechanism, mounting devices tend to be somewhat cumbersome and generally do not allow for easy removal.

Therefore, what is desired is a way for securely attaching a tablet device to a stand where it can be removed and replaced with ease.

SUMMARY

The paper describes many embodiments that relate to an apparatus for magnetically supporting a tablet computer.

A stand for magnetically securing a tablet device is disclosed. The tablet device has a magnetic attachment system disposed within a first portion of a tablet device housing. The stand includes the following components: (1) a cupped portion, and (2) a magnetic attachment mechanism. The cupped portion has an interior with a size and shape arranged to accommodate the first portion of the tablet device by providing a friction force to an exterior surface of the tablet device housing. The magnetic attachment mechanism includes a magnetic element for magnetically interacting with the magnetic attachment system, the magnetic interaction causing the cupped portion to secure the tablet device.

In a particular embodiment, a metallic shunt portion is attached to an exterior surface of the magnetic element for redirecting a portion of a magnetic field emanating from the magnetic element towards the interior of the cupped portion thereby increasing the magnetic interaction. The magnetic shunt portion also secures the magnetic element within the cupped portion.

A magnetic mount for releasably securing a tablet device to a vehicle console is disclosed. The magnetic mount includes the following components: (1) a mounting connector compatible with a vehicle attachment point on the vehicle console; (2) a metallic shunt which positions a plurality of permanent magnets within the magnetic mount, and prevents a magnetic field emanating from the permanent magnets from leaking energy out of the back or sides of the magnetic stand; (3) a specific magnetic signature built into at least one of the plurality of permanent magnets, wherein the tablet device can recognize the magnetic signature as being attached to a vehicle mount; and (4) a cupped portion arranged to provide a friction force for rigidly supporting at least one side of the tablet device, and a structure for shielding the magnetic field emanating from the permanent magnets while the magnetic stand is not in use, where the metallic shunt is mechanically attached to a bottom outer surface of the cupped portion and furthermore where the magnetic field acts to hold a portion of the tablet device securely within the cupped portion.

A detachable motor vehicle communication system is disclosed. The system includes: a tablet device and a stand for detachably securing the tablet device to an interior surface of the motor vehicle. The tablet device includes a display for presenting visual information, a wireless communication interface, and a magnetic attachment mechanism. The stand includes: a magnetic attachment unit that interacts with the tablet's magnetic attachment mechanism to secure the tablet device and the stand. The tablet device also includes a sensor which senses that the tablet device is secured to the stand causing the tablet device to automatically interact with the motor vehicle in a wireless mode.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

Representative applications of apparatuses and methods according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

Tablet devices are used in an increasingly wide range of applications. In many of these applications a way for conveniently mounting the device is required. A number of manufacturers have produced mechanical devices to accomplish this purpose; however since most tablets have no built in mounting mechanism the mounting device tends to be somewhat cumbersome and not easily removable. For example, in an upscale restaurant that has switched from paper menus and waiters to a tablet based ordering system customers might prefer to remove the tablet device from its stand while they peruse the menu. Forcing the diners to remove the tablet from a complex mechanical contraption will probably detract from the overall experience. It might even contribute to some of the tablet devices being dropped or damaged. Although most tablets do not include external attachment features, the iPad® 2 manufactured by Apple Inc. of Cupertino, Calif. does include magnetic attachment points. The magnetic attachment points have been used nearly exclusively for attaching foldable cover attachments to one side of a tablet device enclosure. Although the foldable cover attachments do conveniently protect the screen from damage, they are not particularly compatible for use as a mounting system. This issue can be overcome by designing a more rigid attachment accessory configured to match up with the magnets built into the tablet device.

Figure 1A:
FIG. 1A shows a perspective view of a magnetic stand in accordance with the described embodiments.
Figure 1B:
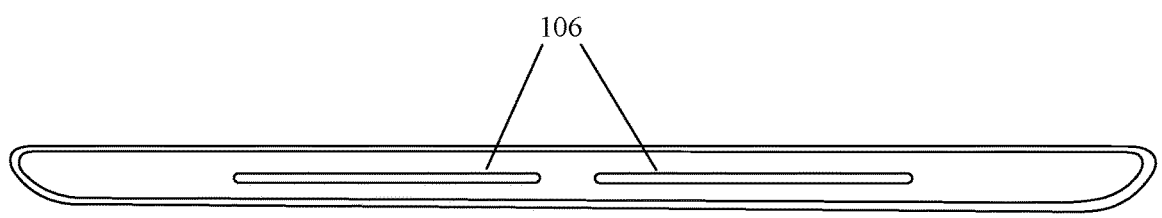
FIG. 1B shows a top view of a magnetic stand in accordance with the described embodiments.

FIGS. 1A and 1B show one such rigid embodiment. FIG. 1A shows a perspective view of one embodiment of a magnetic stand, where a cup portion 102 is configured to slide over a long end of a tablet device and a metallic shunt portion 104 is rigidly attached to the bottom of cup portion 102, which position magnets (not shown) on the bottom side of cup portion 102. Metallic shunt portion 104 also functions to prevent magnetic energy from leaking out of the bottom or sides of the magnetic stand. Cup portion 102 can conform to the long end of the tablet device and creates a rigid structure to hold a tablet device in place. FIG. 1B shows a top view of the embodiment. In FIG. 1B magnetic elements 106 are shown and arranged in a configuration to match up with magnets built into a tablet device. One challenge of providing a strong enough attachment to the tablet is that a stronger field is larger and can have detrimental effects on nearby magnetized objects such as the magnetic stripes on credit cards and bus passes. The described embodiment addresses these challenges in two ways. First the magnets can be rare-earth magnets. Neodymium magnets (the strongest type of rare-earth magnets) in particular can be configured with a large magnetic field, and that field can be channeled into a well-defined directional pattern. Additionally the magnetic field strength can be configured to decrease dramatically at the end of the designed field area, vice being allowed to slowly diminish and potentially unpredictably affect items farther away. Second the position of the magnets at the bottom of the cup portion effectively shields the magnetic field from inadvertent interaction with other objects. A further precaution can be taken to avoid effects on neighboring magnetic objects. Spring mounted doors can be installed on the opening to the cup portion to prevent sensitive magnetic objects from inadvertently entering the cup portion and being adversely affected, while still allowing a tablet device to be pushed through and securely seated.

Figure 1C:
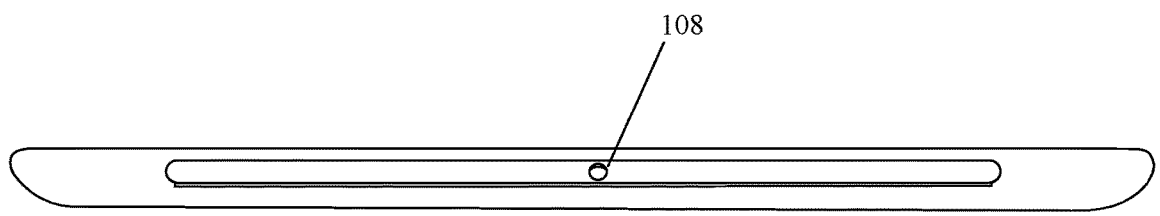
FIG. 1C shows a bottom view of a magnetic stand in accordance with the described embodiments.
Figure 1D:
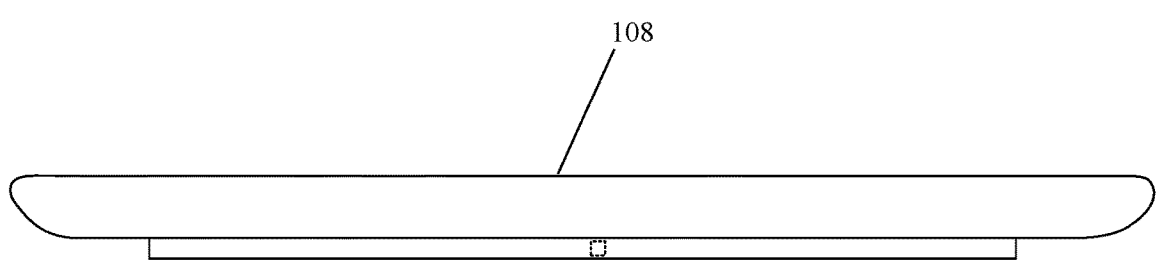
FIG. 1D shows a front view of a magnetic stand in accordance with the described embodiments

FIG. 1C shows a bottom view of the described embodiment. In this view mounting connector 108 is visible. This can be a quarter inch threaded hole as shown in the figure for allowing for easy mounting on existing accessory devices. Mounting connector 108 could also take the form of a clip, clamp, suction cup, or any other means of attachment. Mounting connector 108 allows a tablet device to be placed in a number of orientations and locations, and because of the nature of the magnetic attachment arrangement it can be easily removed and replaced.

Figure 2:
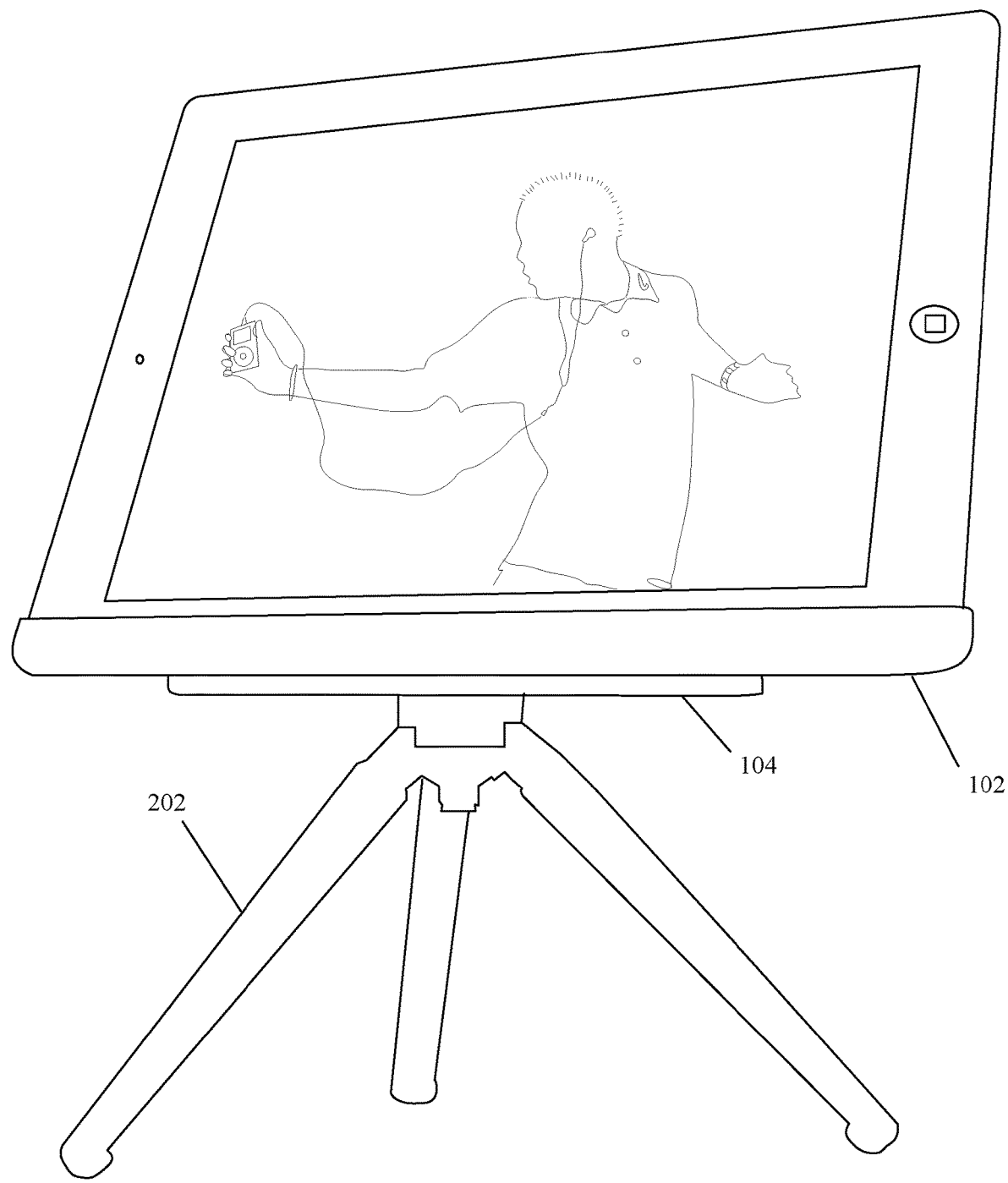
FIG. 2 shows a magnetic stand holding a tablet device mounted on a small tripod in accordance with the described embodiments.

FIG. 2 shows one use of the magnetic stand in accordance with the described embodiments. In this embodiment the magnetic stand is attached to a small tripod 202 via a one quarter inch tripod mount. In this configuration the tablet can be used by a photographer or videographer for reviewing photos or video as they are taken. A wireless transmitter can send data between the camera and the tablet device via a Wi-Fi signal, Bluetooth protocol, or even through an alternative signal received by a wireless receiver attached to the tablet device. In this way a light and portable secondary display can be easily configured for reviewing and displaying products without having to bring along a larger laptop or desktop computer. This configuration can also be useful at a restaurant table allowing specials to be displayed; customers could then touch the displayed special, and then receive more information. If the device were also configured to accept orders the customers might decide to remove the device and enter further details such as table location or payment means into the tablet device.

Figure 3:
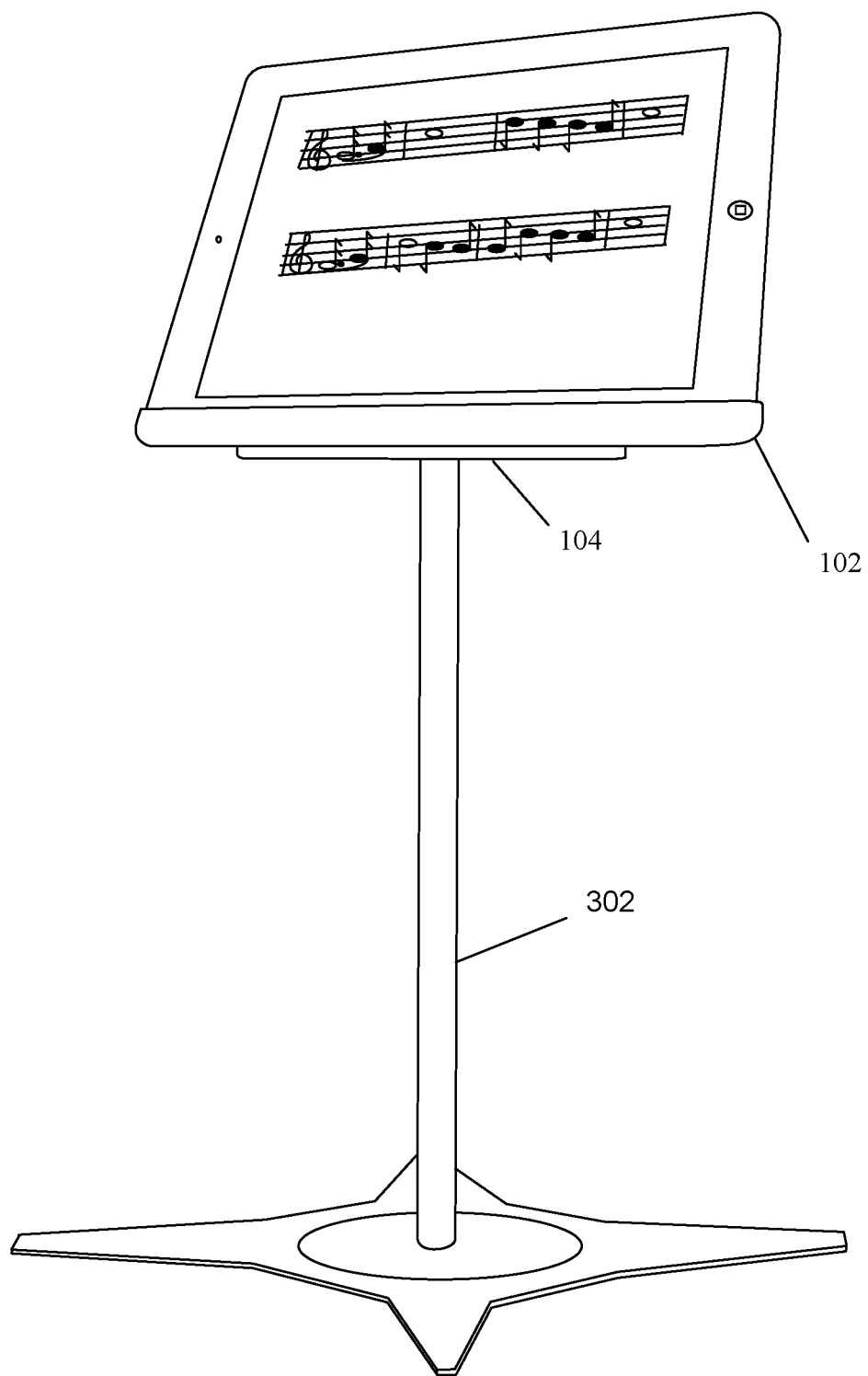
FIG. 3 shows a magnetic stand attached to the top of a music stand in accordance with the described embodiments.

FIG. 3 shows another use of the tablet device holder in accordance with the described embodiments. In this embodiment the tablet holder can be used to support a music stand 302 used to display sheet music on tablet screen. In this way, the strong magnetic connection between the tablet and the tablet holder would allow for a musician to quickly swipe the screen when page turns are required, without having to worry about the possibility of knocking it off its support. A more advanced software configuration can allow the tablet device to turn the pages for the musician at appropriate points in the song. Another software implementation can allow the music to be advanced line by line. In another implementation a conductor can even wirelessly adjust the flow of the music played by a band with another stand mounted tablet, allowing the band to quickly adapt to last minute changes in a musical program.

Figure 4:
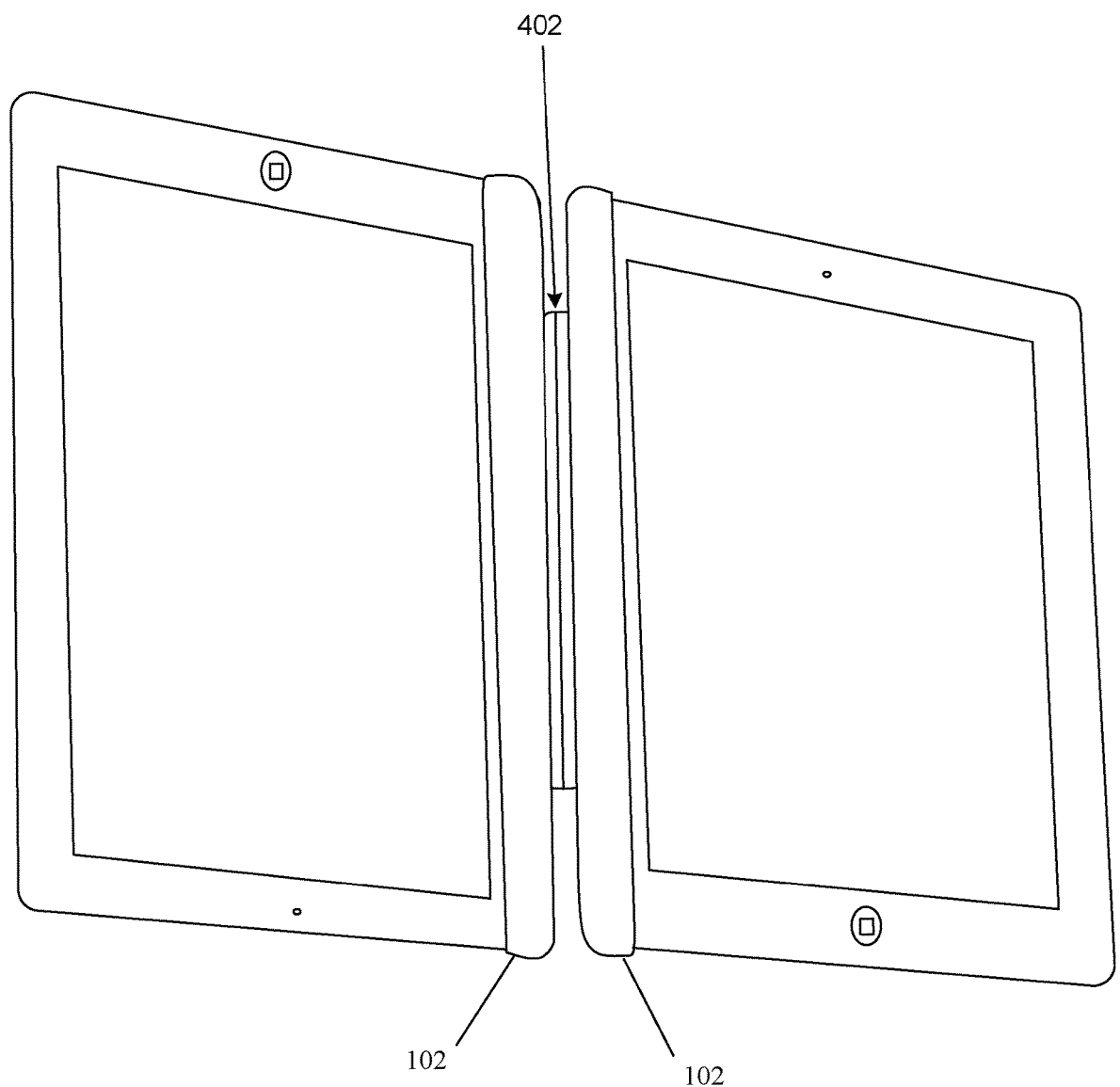
FIG. 4 shows an alternate embodiment of the magnetic stand with two attachment features linked by a hinge for use with two tablet devices.

FIG. 4 shows another embodiment of the tablet holder. In this embodiment the tablet device holder can be configured with two tablet devices secured together by stiff hinge 402. Tablet devices which only contain a strong set of magnets on one side of the enclosure can be inserted into the tablet device holder in alternating directions as shown in the figure to maximize the magnetic attraction forces. In this configuration the tablets can be configured to work together cooperatively. The cooperation can occur over a wireless channel, or the tablet devices can be configured to include a wired connector (not shown) allowing communication to run through a wire that runs between the devices and the connector. Once a communication channel is established the tablet devices can work together to allow activities like book reading or even be configured in more of a laptop arrangement. Without the extra magnetic power enabled by the cup portion of the tablet holder the tablet holder would not be strong enough to maintain a tablet in the orientation normally assumed by a laptop computer screen. In this way the described embodiment allows a user with two tablet devices to configure a virtual keyboard on one tablet device with a working document on the second tablet display.

Figure 5A:
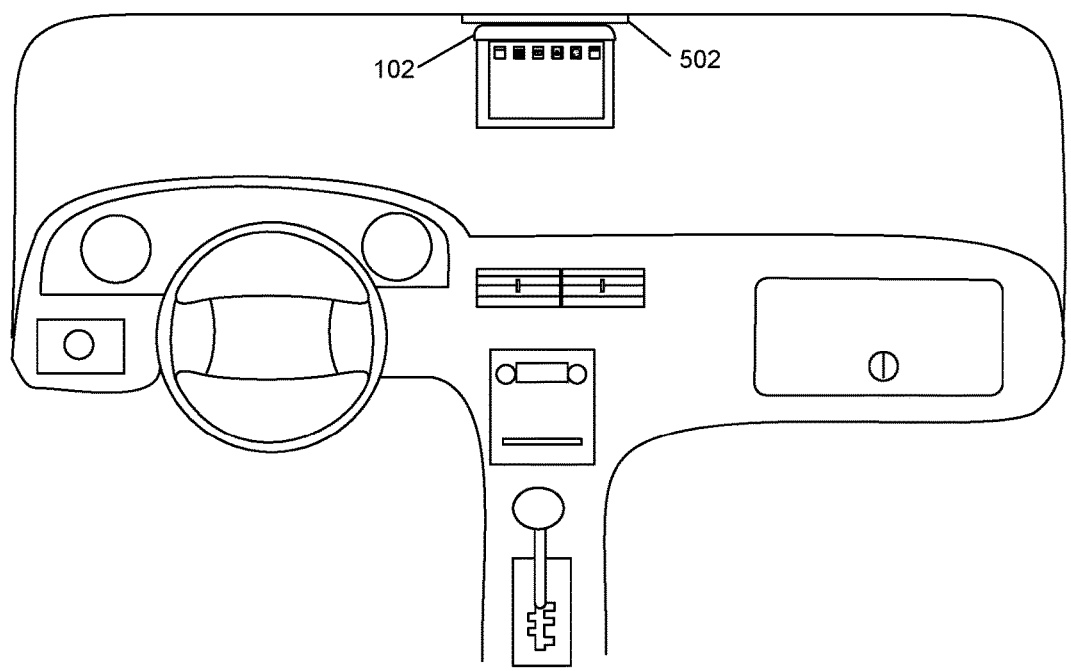
FIG. 5A shows a tablet device attached to the roof of a car with a magnetic stand in accordance with the described embodiments.
Figure 5B:
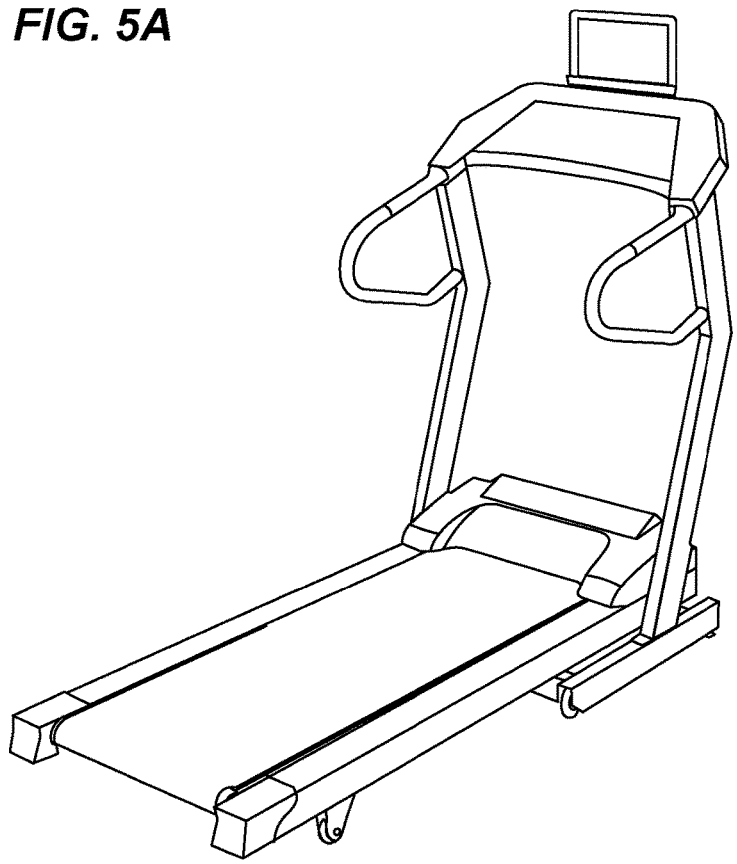
FIG. 5B shows a tablet device attached to a treadmill with a magnetic stand in accordance with the described embodiments.

In other embodiments of the magnetic stand accessory items can be securely attached to a tablet device. This might include devices such as video game controllers, physical keyboards, or even a robust stylus holder. In particular video game controllers need a strong connection to a tablet device to provide a robust control configuration for serious gaming enthusiasts. FIG. 5A shows a magnetic stand supporting a tablet device from above, mounted to vehicle console 502 of an automobile. This makes it easy for a passenger to securely mount the tablet device inside the car and to easily remove it before leaving the vehicle. A vehicle mounted tablet mount can allow a number of additional features to be built into the mount. In this way the tablet could automatically connect to electronic devices built into the car itself. Given prior setup and pairing, Bluetooth and WiFi radio connections could be established moments after the tablet was snapped into place. With these connections activated car manufacturers could allow navigation, backup camera video, music selection, or even vehicle performance data to be displayed in the tablet device. Since a majority of tablet devices include microphones, voice automation can allow drivers to safely interact with the device while driving. A magnetic stand is shown attached with a tablet device in this manner to vehicle console 502 and can be attached via a clutch hinge which would allow the tablet to fold up into vehicle console 502 while not in use. Hall Effect sensors built into the face of the tablet device could sense an additional magnet or magnets built into vehicle console 502 of the vehicle, and the resultant magnetic field can function as a signal to the tablet to automatically secure itself once the tablet is rotated up into the console in close proximity to those magnets, and then to reactivate itself once it is pulled back down, thereby conserving battery life and easing activation. In FIG. 5B a magnetic stand is configured on the front of a treadmill for watching a movie or a television show while jogging or walking. The tablet could also be configured to control various aspects of the treadmill.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A portable electronic system, comprising:
    a first electronic device that includes a first housing, the first housing carrying a first display, a first magnet, and a first connector;
    a second electronic device that includes a second housing, the second housing carrying a second display, a second magnet, and a second connector; and
    a hinge assembly that allows rotation between the first electronic device and the second electronic device, the hinge assembly capable of establishing a communication channel between the first connector and the second connector, the hinge assembly comprising:
        a first concave portion that is contoured to the first housing,
        a first hinge magnet configured to magnetically couple with the first magnet,
        a second concave portion that is contoured to the second housing, and
        a second hinge magnet configured to magnetically couple with the second magnet.

2. The portable electronic system of claim 1, wherein the first display presents a software program, and wherein the second display presents an input mechanism capable of providing an input to manipulate the software program.

3. The portable electronic system of claim 1, wherein the hinge assembly comprises:
    a first cupped portion that is contoured to the first housing; and
    a second cupped portion that is contoured to the second housing.

4. The portable electronic system of claim 3, wherein the first display in communication with the second display when i) the first hinge magnetic is magnetically coupled with the first magnet and ii) the second hinge magnet is magnetically coupled with the second magnet.

5. The portable electronic system of claim 4, wherein the first display is automatically connected to the second display when i) the first hinge magnet is magnetically coupled with the first magnet and ii) the second hinge magnet is magnetically coupled with the second magnet.

6. The portable electronic of system claim 1, wherein the hinge assembly is capable of fixing the first housing relative to the second housing.

7. A computing system, comprising:
    a first housing that carries a first display and a first magnet;
    a second housing that carries a second display and a second magnet; and
    a hinge assembly that allows rotation of the first housing relative to the second housing, and vice versa, the hinge assembly comprising:
        a first cupped portion that is contoured with a size and shape that at least partially conforms to that of the first housing such that the at least a portion of the first housing fits within the first cupped portion, the first cupped portion comprising a first magnetic element that that magnetically couples with the first magnet, and a second cupped portion comprises a second cupped portion that is contoured with a size and shape that at least partially conforms to that of the second housing such that the at least a portion of the second housing fits within the second cupped portion, the second cupped portion comprising a second magnetic element that that magnetically couples with first magnet.

8. The computing system of claim 7, wherein receipt of i) the first housing into the first cupped portion and ii) the second housing into the second cupped portion causes the first electronic device to automatically connect to the second electronic device.

9. The computing system of claim 7, wherein the first display presents a software program, and wherein the second display presents a keyboard capable of providing an input to manipulate the software program.

10. The computing system of claim 7, wherein the hinge assembly is capable of holding the first housing in a fixed positioned relative to the second housing.

11. The computing system of claim 7, wherein the first display is in communication with the second display via a wired connection.

12. The computing system of claim 7, wherein the first display is in communication with the second display via a wireless connection.

13. A portable electronic device, comprising:
a housing that defines an internal volume;
a display that is carried by the housing;
a device magnet located in the internal volume; and
a hinge assembly coupled with the housing, the hinge assembly comprising:
a first hinge magnet that is magnetically coupled with the device magnet, and
a concave portion that carries a second hinge magnet, the concave portion capable of receiving an external portable electronic device that includes a magnet, wherein the second hinge magnet magnetically couples with the magnet when the external portable electronic device is received by the concave portion.

14. The portable electronic device of claim 13, wherein communication between the display and the external portable electronic device is initiated when the external portable electronic device is received by the concave portion.

15. The portable electronic device of claim 14, wherein the display is in communication with the external portable electronic device via a wired connection.

16. The portable electronic device of claim 14, wherein the display is in communication with the external portable electronic device via a wireless connection.

17. The portable electronic device of claim 13, wherein the hinge assembly is capable of fixing the housing relative to the external portable electronic device.

18. The portable electronic device of claim 13, wherein the concave portion comprises a slot that includes a size and shape in accordance with the external portable electronic device.

19. The portable electronic device of claim 13, wherein the hinge assembly is capable of detachably coupling to the external portable electronic device at the concave portion.

* * * * *

UNITED STATES PATENT AND TRADEMARK OFFICE
CERTIFICATE OF CORRECTION

Page 1 of 1

PATENT NO.        : 10,694,629 B2
APPLICATION NO.   : 16/277985
DATED             : June 23, 2020
INVENTOR(S)       : Matthew D. Rohrbach It is certified that error appears in the above-identified patent and that said Letters Patent is hereby corrected as shown below:

In the Claims

In Claim 6, at Column 6, Line 54: "The portable electronic of system claim 1," should read -- The portable electronic system of claim 1, --.

Signed and Sealed this
Seventeenth Day of November, 2020

Andrei Iancu
*Director of the United States Patent and Trademark Office*